(12) United States Patent
Abuelsaad et al.

(10) Patent No.: US 9,370,125 B2
(45) Date of Patent: Jun. 14, 2016

(54) HIVE OF SMART DATA CENTER TILES

(71) Applicant: GLOBALFOUNDRIES INC., Grand Cayman (KY)

(72) Inventors: Tamer E. Abuelsaad, Somers, NY (US); Thomas E. Cook, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 398 days.

(21) Appl. No.: 13/943,295

(22) Filed: Jul. 16, 2013

(65) Prior Publication Data

US 2015/0025690 A1     Jan. 22, 2015

(51) Int. Cl.
  *G05D 23/19* (2006.01)
  *H05K 7/20* (2006.01)

(52) U.S. Cl.
  CPC ........ *H05K 7/20745* (2013.01); *G05D 23/1934* (2013.01); *H05K 7/20836* (2013.01)

(58) Field of Classification Search
  CPC .......... H05K 7/20745; H05K 7/20836; G05D 23/1934
  USPC ........... 700/276, 299, 300; 454/186, 239, 256
  See application file for complete search history.

(56) References Cited

U.S. PATENT DOCUMENTS

| | | | |
|---|---|---|---|
| 6,603,082 B1 | 8/2003 | Delbruck et al. | |
| 6,881,142 B1* | 4/2005 | Nair | F24F 11/0001 236/49.3 |
| 7,214,131 B2 | 5/2007 | Malone | |
| 7,251,547 B2* | 7/2007 | Bash | G05D 23/1934 62/186 |
| 7,313,924 B2* | 1/2008 | Bash | H05K 7/20745 361/692 |
| 7,331,686 B2* | 2/2008 | Ossevoort | H05B 37/0209 345/173 |
| 8,382,565 B2* | 2/2013 | Dawson | F24F 7/10 165/53 |
| 8,882,572 B2* | 11/2014 | McReynolds | G05D 23/2716 137/343 |
| 2004/0141542 A1* | 7/2004 | Sharma | G01K 7/42 374/141 |
| 2005/0075065 A1* | 4/2005 | Nair | F24F 11/0001 454/186 |
| 2005/0182523 A1* | 8/2005 | Nair | F24F 11/0001 700/276 |
| 2007/0069021 A1 | 3/2007 | Elrod et al. | |
| 2007/0171086 A1 | 7/2007 | Belady | |
| 2009/0150123 A1* | 6/2009 | Archibald | G06F 17/5004 703/1 |

(Continued)

OTHER PUBLICATIONS

Leikas et al., "IMS—Intuitive Movement Sensing Method", VTT Information Technology, Smart Object Conference: Proceedings, pp. 200-203, May 2003, Grenoble.

(Continued)

*Primary Examiner* — Charles Kasenge
(74) *Attorney, Agent, or Firm* — Scully Scott Murphy and Presser

(57) ABSTRACT

A smart tile system and methodology, each tile having a sensor device and control unit for monitoring an environmental condition of a room or space. A plurality of smart tiles form a hive community resulting in a tightly coupled sensor network configured to communicate in clusters and collaborate to accomplish missions. One of the missions is environmental control which is communicated to a tile in the form of a policy. The tiles around one piece of equipment in the room or space may control the regulating of cooling/heating for just that one piece of equipment allowing little to not impact of other equipment(s) in the room. The smart tile of the hive communicate over a mesh network protocol, and one or more smart tiles comprise a vent under actuator control wherein the tile is configured to receive commands to adjust the vent opening according to a desired setting.

17 Claims, 4 Drawing Sheets

(56) References Cited

U.S. PATENT DOCUMENTS

| | | | |
|---|---|---|---|
| 2009/0156114 A1 | 6/2009 | Ahladas et al. | |
| 2010/0311317 A1* | 12/2010 | McReynolds | G05D 23/2716 454/256 |
| 2014/0133137 A1* | 5/2014 | Kiss | F21S 2/005 362/145 |
| 2014/0307118 A1* | 10/2014 | MacKinnon | G01L 1/00 348/222.1 |

OTHER PUBLICATIONS

Orr et al., Abstract of: "The Smart Floor: A Mechanism for Natural User Identification and Tracking", Proceedings of the 2000 Conference on Human Factors in Computing Systems, (CHI 2000) The Hague, Netherlands, Apr. 2000, CHI '00 Extended Abstracts on Human Factors in Computing Systems, ACM, New York, NY, USA, pp. 275-276, ISBN: 1-58113-248-4.

Orr et al., "The Smart Floor: A Mechanism for Natural User Identification and Tracking", Graphics, Visualization, and Usability (GVU) Center, Georgia Institute of Technology, Atlanta, GA 30332-0280 USA, 2000.

Baumgartner et al., "Demo Abstract: Hallway Monitoring with Sensor Network", Copyright is held by the author/owner(s) SenSys'09, Nov. 4-6, 2009, Berkley, CA, USA, ACM 978-1-60558-748-6.

\* cited by examiner

HIVE OF SMART DATA CENTER TILES

FIELD OF THE INVENTION

The present disclosure relates to management of data centers generally, that house multiple computing devices, systems, servers, workstations, data storage devices, etc; and particularly automating management of data centers using smart data center tiles cooperatively interacting to provide intelligent automation of environmental controls (e.g., temperature control such as heating, cooling), and ventilation such as in a raised floor support infrastructure.

BACKGROUND

The consumption of power and the dissipation of heat in data centers is expanding everyday. With mega-datacenters opening around the world, efficiencies in cooling, monitoring, and managing these data centers can significantly reduce cost, power consumption, and improve system up-time and reliability. Tracking of systems, automating cooling, and overall data center management is still mostly a manual process in the data center. For example, monitoring temperatures inside of Data Centers has been a manual process where employees walk around the data center and gather temperature information. Assignee IBM (International Business Machines, Inc.) is a leader in developing new technology such as robotic temperature sensing systems that automatically traverse a data center gathering temperature information.

Take for example the sensing of temperature at various points inside of a raised floor. If the human or robot takes a set of temperature readings across the data center, the data is analyzed for temperature hot spots or cold spots. Thermal adjustments are made by altering the duct work or baffling to better distribute cooling; normally done underneath the raised floor. Although there are some electronic valves that are marketed, the entire data center temperature equilibrium process is a manual event.

Regarding tracking systems, only recently are RFID's being considered as additions to data center devices and racks. This process again is a manual process implemented by data center and raised floor employees. However, RFID's by themselves are not a solution. These RFID's need to be read by a human carrying a reader or by a robot that periodically scans the data center.

Although data centers are getting smarter to some degree, the speed of evolution is not matching the speed at which data centers are being created, consuming power, and being distributed worldwide. A better solution for automating data centers via core construction is needed.

SUMMARY

There is provided a system and methodology for data center management, heating, cooling, and ventilation.

In one aspect, a smart tile system and methodology is provided. The system includes smart tiles having a sensor device and control unit for monitoring an environmental condition of a room or space. A plurality of smart tiles form a hive community resulting in a tightly coupled sensor network configured to communicate in clusters and collaborate to accomplish missions. One of the missions is environmental control which is communicated to a tile in the form of a policy. The tiles around one piece of equipment in the room or space may control the turning on of cooling/heating for just that one piece of equipment allowing little to not impact of other equipment(s) in the room. The smart tile of the hive communicate over a mesh network protocol, and one or more smart tiles comprise a vent under actuator control wherein the tile is configured to receive commands to adjust the vent opening according to a desired setting.

Thus, there is provided a system for controlling environmental conditions in a room. The system comprises a plurality of room tiles for placement in the room, each floor tile having a sensor to obtain a sensed environment condition information; and a control processing unit embedded in the tile configured to receive the obtained environment condition information from a sensor of one or more the plurality of room tiles, and in response, regulating the environmental condition in the room according to a desired environmental condition setting.

In a further embodiment, there is provided a method of controlling environmental conditions in a room. The method comprises: providing a plurality of smart room tiles on a floor, a smart tile comprising: at least one sensor embedded in the tile to obtain environment condition information of a room including the room tile; and a control processing unit receiving indication of a desired environmental condition of the room; and, a communications sub-system embedded in the tile, the communications sub-system configured to communicate signals according to a communication protocol, receiving at a communications sub-system of one or more smart room tiles, one or more signals indicating a desired environmental condition setting; communicating signals amongst one or more other smart room tiles with the desired environmental condition setting; and using the one or more smart room tiles to cooperatively achieve regulating the environmental condition according to the desired environmental condition setting.

In a further embodiment, there is provided a smart room tile comprising: at least one sensor embedded in the tile to obtain environment condition information of a room including the room tile; a control processing unit receiving indication of a desired environmental condition of the room and, regulating the environmental condition in the room according to the desired environmental condition setting.

A computer program product is provided for performing operations. The computer program product includes a storage medium readable by a processing circuit and storing instructions run by the processing circuit for running a method. The method is the same as listed above.

BRIEF DESCRIPTION OF THE DRAWINGS

The present invention will be described with reference to FIGS. 1-4. When referring to the figures, like elements shown throughout are indicated with like reference numerals.

DETAILED DESCRIPTION

The present system and methods address a number of challenges when managing automated data centers. In one embodiment, a raised floor management system and a system and methodology is provided.

A data center is a facility used to house computer systems and associated components, such as telecommunications and storage systems. Often, the data center includes redundant or backup power supplies, redundant data communications connections, environmental controls and security devices.

Figure 3:
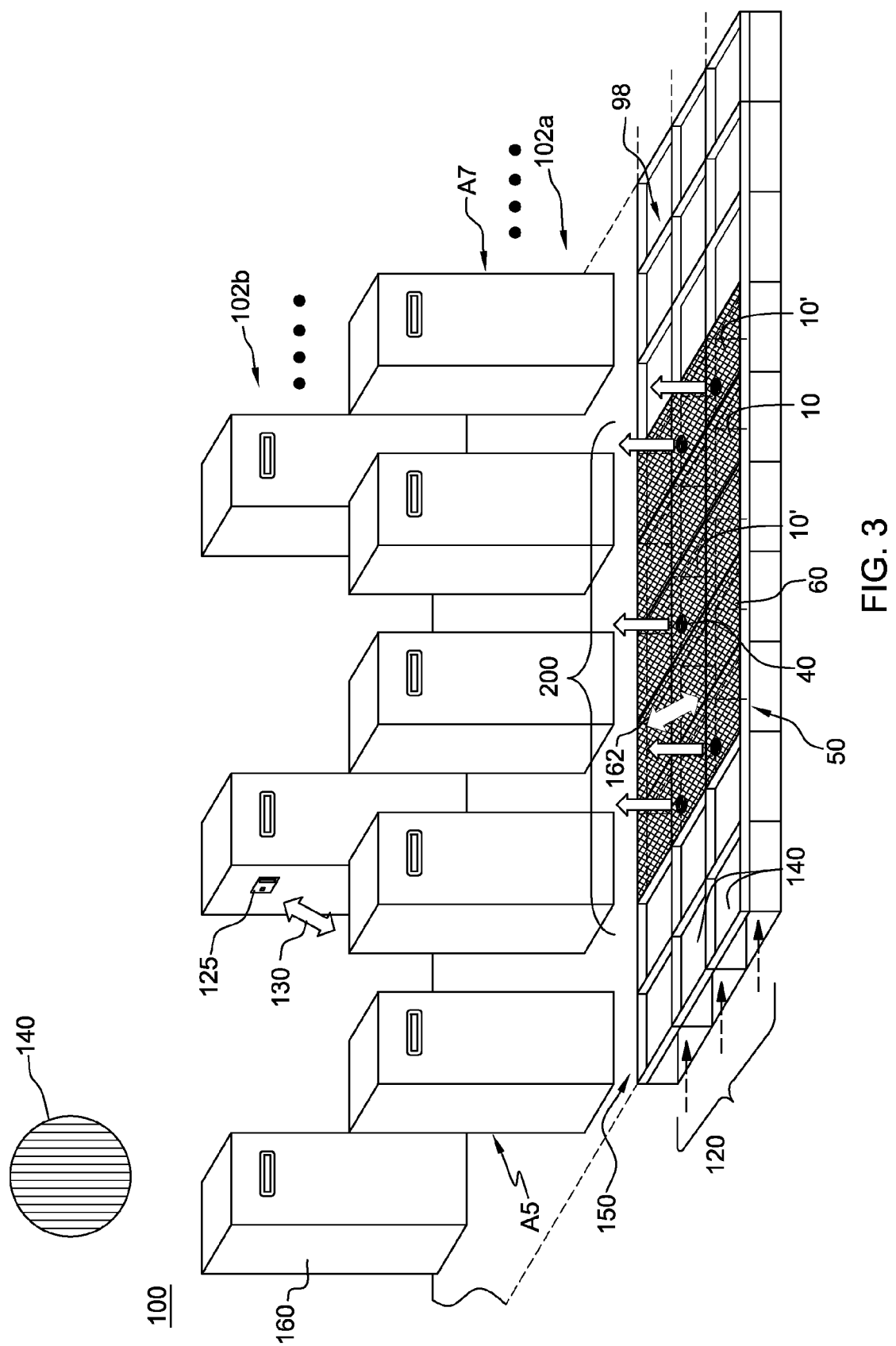
FIG. 3 shows a data room center incorporating the smart floor tile hive infrastructure of FIG. 2.

For non-limiting purposes of illustration, the raised floor management system is as shown in FIG. 3 employed in a data center room 100 for equipments such as computer systems, e.g., servers, that are typically built with a raised floor 150 about an erected scaffolding system 98 that will suspend racks 102a, 102b of the computer systems approximately 1 foot off the ground. Underneath the raised floor 150 along with networking and power distribution is a set of cooling and other systems for providing environmental control. The tiles of a raised floor are very heavy-duty to support the weight of systems. The tiles can either be vented to allow air to flow in or out, or be solid in which case air does not permeate the tile. Tiles are simply supporting layers for systems above them and may comprise ceramic, wood, plastic or other flooring material or combinations of materials thereof as known in the art.

Figure 1B:
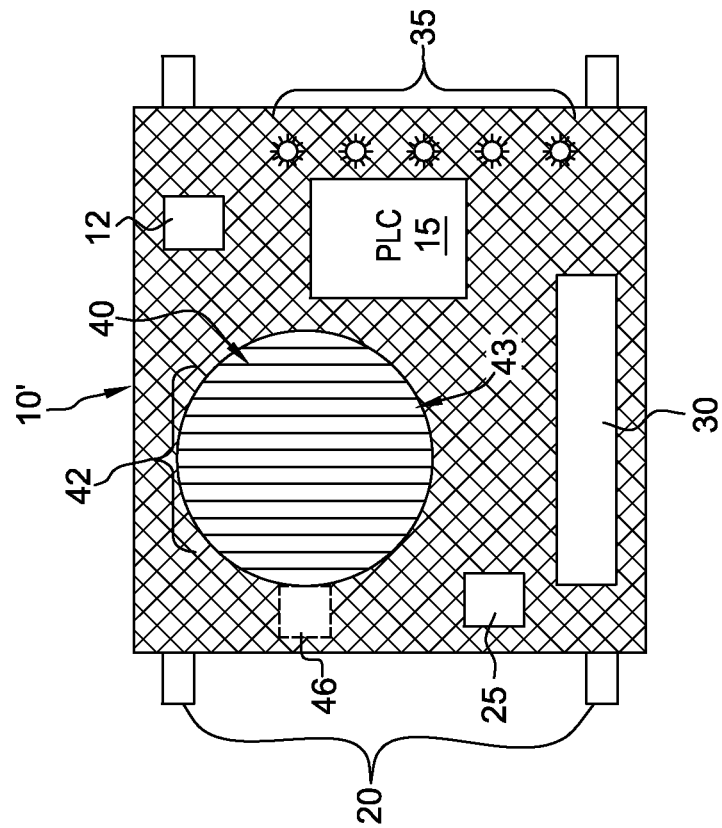
FIG. 1B shows a smart floor tile in a further embodiment equipped with actuator controlled vent.
Figure 1A:
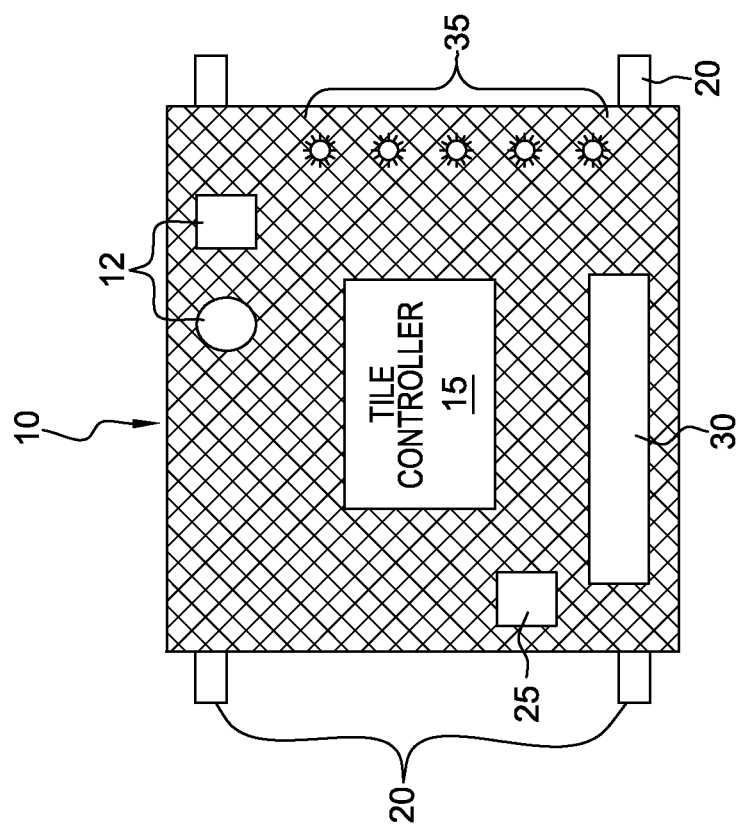
FIG. 1A shows a smart floor tile in one embodiment.

In particular, the raised floor management system and methodology make use of a "Smart Tile" such as smart tile 10 shown in FIG. 1A. Smart tile 10 is a supportive floor tile built with one or more sensors and embedded logic/control. In one embodiment, each Smart Tile includes, but is not limited to: a set of sensor devices 12 for sensing environmental conditions and/or providing or obtaining measurements within the data center; a very lightweight embedded control system 15, and a wired or wireless communication capability. Some or all of the floor titles inside of a data center room may be Smart tiles 10. In one embodiment, as shown in FIG. 1A, the sensor devices 12 may include, but are not limited to: a temperature sensor for performing one or more sensing and measuring functions, such as a measurement of temperature around a supported data center device, e.g., a rack of servers. Other sensor devices may be provided, as appropriate, for monitoring data center room environmental conditions or for performing other sets of functions, e.g., pressure sensing, humidity level measuring, radiation level measuring, ambient light measurements, air quality sensor/detector, debris level sensor/detector, certain chemical fume levels sensor/detector, etc. Further sensors may be embedded in or located on the smart tile to perform biological material spill detection, chemical/petroleum spill detection, electro-magnetic radiation detection, motion type sensors to see if the tile has been moved, a deflection sensor for determining a weight upon the tile, a global positioning satellite (GPS) detections if a GPS satellite signal could be obtained, or even a compass to indicate a direction, e.g., facing North, etc.

Still referring to FIG. 1A, the very lightweight embedded control system 15 may include a programmed control unit, such as a programmed microprocessor unit having a coupled memory and providing input/output (I/O) functions for controlling tile, sensor and/or environmental control operations. The programmed microprocessor device may be an embedded full computing node. In one embodiment, the programmed control unit may include a programmable logic controller device (PLC) and an associated memory block, configured for controlling operations on the tile in response to received external wireless communication or command, or a sensed condition within the data center. Whether implemented as a programmed microprocessor unit or a PLC, for purposes of description, the programmed control unit is herein referred to as an embedded system/controller.

As shown in FIG. 1A, each smart tile 10 may be provided with conductive side or edge markers 20, i.e., conductive or wire structures that enable mesh communication with an immediate adjacent (i.e., neighboring) tile. The side markers could be located on smart tile edges. FIGS. 1A, 1B show the implementation of side markers 20, i.e., conductive structures and/or sensors (that are used for communicating mesh network communications with the similarly structured respective side markers of a neighboring tile.

For example, in another embodiment, the side markers 20 do not have to be actually wired or physically connected to an edge marker of an adjacent tile. For example, the smart tile 10/10' can have a combination of RFID sensors and readers along the edges or some other method of passive, nonconductive sensing means.

Still referring to FIG. 1A, a wireless communications subsystem 30 is situated in the Smart tile including one or more communications devices, e.g., a Bluetooth sender/receiver or transceiver 15, for transmitting signals to and receiving signals from communications devices of other smart tiles according to a mesh network communications standard.

Each tile 10 may be further provided with a power source or energy supply 25, e.g., a rechargeable battery, or other stored energy source, for powering up sensor, embedded system/controller and communications elements. In one embodiment, each smart tile 10 is initially pre-charged, e.g., from a factory, and is power efficient enough to remain charged for an amount of time, e.g., two years. This power source supply component may be rechargeable, e.g., via a robotic induction charging system (not shown) or by any like rechargeable means. In other embodiments, other power charging techniques are used, such as hard wiring, e.g., electrical wire to receive power from a standard power source, a wall outlet, etc. This hardwire may be located under the tiles, e.g., routed near ductwork underneath the raised floor tiles. Alternatively, wireless power may be transferred from a neighboring server.

In a further embodiment, as shown in the tiles 10 and 10' of respective FIGS. 1A and 1B, the tile may be further equipped with one or more illumination sources, e.g., LEDs 35 that may be programmed to illuminate, e.g., under certain conditions. For example, the tile may be controlled or programmed for illumination if the tile is within a determined problematic zone. A problematic zone is an area or device in the data center or monitored room that exhibit conditions, e.g., temperature that can not be regulated via a tile(s) or the smart tile "hive" of a plurality of tiles 50. This may be a result of conditions beyond control of the tile 10, e.g., a stuck ventilator actuator or faulty temperature sensor. The purpose of the illumination is to attract/direct attention of a human or some device, such as a robot, when performing a visual inspection of the room's operating environment.

Further, as shown in the smart tile 10' embodiment of FIG. 1B, there is provided mechanical controls 46 for interacting with room controls, such as ducts. That is, in a further embodiment, shown in FIG. 1B, one or more smart tiles 10' may include a controllable vent 40, that may be controllably opened, under smart tile 10 embedded system/controller control, to any programmed degree for opening or closing. The vent 40 that may be included in the smart tile is not limited to any particular embodiment, e.g., it could be a system of fins, grills or a louvre system 42 and/or openings 43 wherein fins may being mechanically actuated, such as by a motor actuation located underneath the tile, by the embedded system/controller. Alternatively, the smart tile may receive a wireless or mesh communication to provide instructions for mechanically controlling the vent or opening. The directionality of air vented through fins or louvre vent 40 may be further controlled by smart tile actuation under embedded programmed system/controller control. The smart tile is not limited to this functionality; it can control as much or as little hardware as it is designed. It can change fin direction, close them, make them spray a gas when built into the hardware capabilities.

In one embodiment, the smart tile 10 may include a wire or conductive structure (not shown) that may be routed externally to provide embedded system/controller generated control signals to external devices. For example, a wire run from a smart tile 10 may be used for controlling a vent on top of the server or server rack rather than underneath it. Alternatively, as shown in FIG. 3, via wireless communications 162, such controls may be communicated by the smart tile, e.g., a smart tile hive "leader" tile 60, to control a remote vent or duct opening 140 in the manner as described herein.

While the system described allows for a network of sensors of varying kinds, it can thus control elements that are near or far away from the tile besides communicating with other tiles to accomplish a mission/task. For example, in one embodiment, the smart tile 10 may communicate with one server device 160 designated as a "central" server. A smart tile may communicate to the central server rather than to another tile, such as for controlling vent 140. For example, if the tile senses it is damaged it may let an administrator know by responsively initiating transmission of an electronic e.g., wireless message. Or it could communicate to a central server that will send the message.

In one embodiment, the central server 160 may optionally be part of a data center network environment which is a computer network (or networks) used for communication within the data center. The data center network environment also includes gateway devices, which may interconnect one data center network environment to another.

Figure 2:
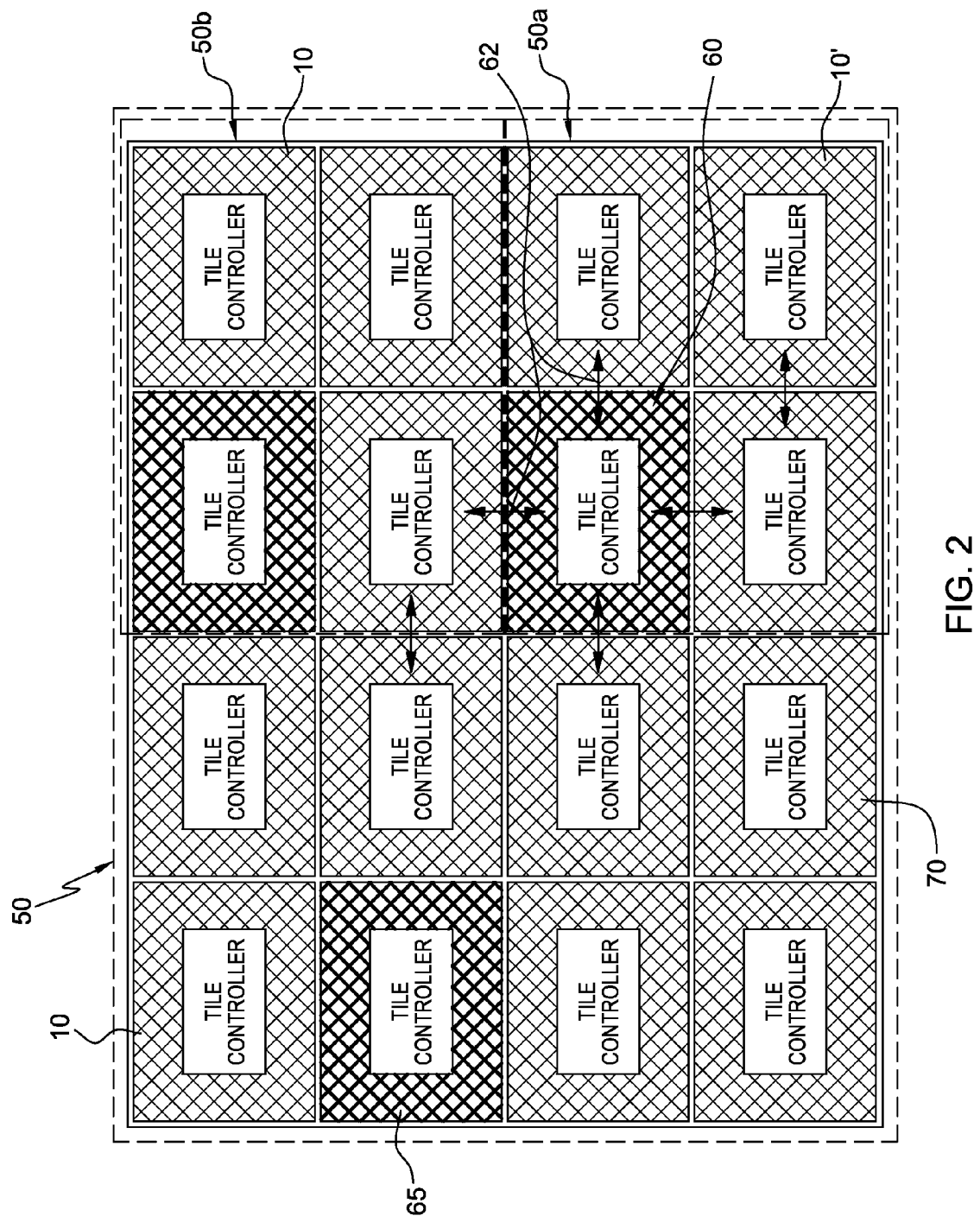
FIG. 2 shows an infrastructure of a smart floor tile hive in a further embodiment.

Upon activation, a Smart tile 10 or 10' communicates in a hive-like methodology or according to a mesh model with other smart tiles 10 in the data center. That is, as shown in FIG. 2, in one embodiment, the tiles 10 communicate as a wireless mesh network (WMN) or alternatively referred to herein as a smart tile "hive" 50 made up of a plurality of nodes (i.e., smart tiles 10) organized in a mesh network topology. While the WMN (smart tile hive) 50 is shown in FIG. 2 as a grid layout, it is understood that other mesh/tile hive configurations are possible. All mesh smart tiles include wireless devices and may function to forward or receive traffic (data and information) to and from other tiles. Current existing methods using wireless mesh communications may be implemented to enable the wireless mesh network (hive) 50 to self form, e.g., such as when a new smart tile is added to the floor infrastructure, it may become a member of a mesh tile community. That is, as shown in FIG. 2, through directed messaging with other smart tiles in the data center via side markers/sensors 20, or directed messaging via wireless communication system 30 with other smart tiles, each smart tile learns its position inside the data center. In one embodiment, to enable a smart tile's learning its position inside the data center, broadcast communications such as initiated from a tile and received through the neighboring tile side markers 30 includes "self-describing" data, i.e., data representing who they are, where they are located, who they are touching and their relationship with neighboring tiles around them. It is understood that in the absence of side markers, a smart tile may wirelessly perform inter-tile communication. In one embodiment, wireless mesh or wireless sensor networks can be implemented with various wireless technology including 802.11, 802.15, 802.16, cellular technologies or combinations of more than one type.

Additionally, through wireless sensing techniques such as via triangulation, when coupled with an embedded compass reading, the tile location may be wirelessly discovered without active location sensing using connected wires or side marker edge sensors.

In the smart tile hive 50, the smart tile 10 itself learns of its position within a hierarchy of tiles inside of the data center and may be programmed how to report sensor data. Each smart tile or a combination thereof in a Smart Tile hive 50 becomes a member of a smart floor tile "community" for the data center for providing control. A Smart Tile 10 will be part of the raised floor hive of tiles, and, can also be a member of a sub hive network 50a, or 50b (i.e., a subset of smart tiles of the smart tile hive 50) in the data center, for example, that is responsible for specific missions/functions. One non-limiting example mission may be to ensure the temperature control of any data room equipment, e.g., a computing device such as a server, or a zone including the server device, does not exceed 71 degrees plus or minus 2 degrees, for example. Another is, ensure radiation level is below 10 μR, for example.

For example, there may be smart tiles that are specialized and reside inside of the Smart Tile hive 50, or comprise a sub-hive 50a, that cooperatively interact to provide unique functions. For example, a thermal control smart tile would have all of the sensor, compute, and hive computing capabilities as regular Smart Tiles but may function as a thermal tile by including ventilation control capabilities such as actuators to open and close venting, or, performing unique functions for the tile community.

One or more tiles in particular of the smart tile hive may further correspond to an anchor or collecting node 65 in the mesh network. The tiles 10 are further capable of communicating with a central (external) system wirelessly.

Implementing such published communications amongst all tiles, a smart hive builds itself an image or map of the data room floor, for example, such that each smart tile has its own identifier and can report heat or temperature or other monitored/sensed data center room environmental attribute information (e.g., temperature, humidity, etc.). Then, by communicating in a mesh network or wireless network according to a conventional protocol, e.g., ZigBee® communication protocol (Trademark of ZigBee Alliance), a dedicated smart tile of the hive, or hive leader, receives the temperature sensor information (i.e., which tiles exhibit which temperature) and builds a room temperature map. Alternatively, each tile itself, via inter-tile communication, may receive the heat information and then build a room temperature map. In one embodiment, to build a map, sensed data is needed from a plurality of smart tiles across the area being mapped. The built map includes a distribution of sensed data over an area encompassing a collection of smart tiles. Thus, in a room broken out into zones, an operator may only want to see the map of a zone 1, or or all zones. Any smart tile building a map must receive all sensed data and location of each measurement so that it can construct this map.

Having knowledge of the smart tile hive configuration, the floor of the data center, i.e., via smart tile(s) embedded system/controller control of a vent(s), can then regulate the air flow by adjustments. An embodiment includes a designated hive leader or designated tiles of the hive initiating closing or opening of a vent to control air flow under program control or via wireless or wired signals carrying instructions received at a smart tile in real-time.

For example, in one embodiment directed to performing a mission of maintaining a constant room temperature, i.e., a weighted averaging or a leveling for temperature, a single hive tile "leader" may set goals of, for example, setting a level 20° C.±3° throughout the data center. Tiles experiencing larger heat fluctuations on the high-end are programmed to send out a request to open vents. Unless an emergency halt operation was sent by the hive tile leader, the "hot" tile is commanded to open its vent. It would sense the temperature and continue this iterative process until it reached a goal of approximately 20° C. The benefit of the hive is that upon sending out a request for permission to open the vents, other tiles which hear about the request to open a vent for more cooling would themselves determine if they should cut back on cooling to help the community. For example, if one server rack was at 18° C. and relatively stable and a request from a tile across the room came in asking for permission to provide more cooling, the 18° C. tile could set itself a new goal of 19° C. thereby providing some buffer for the hot area. This arbitration and cohabitation model slowly renders an even heated and even cooled data center.

With respect to the designation of a smart tile hive "leader" tile, a smart tile leader may be set manually, e.g., set via a software or a hardware flag in the actual tile 10/10'. A smart tile hive leader may default to a most capable, functionality wise, or based on some criteria; or the hive leader is elected by one or multiple other tiles. A leader "election" process may be implemented. Otherwise, a designated smart tile leader may be randomly selected, or multiple tiles may elect a hive leader.

FIG. 3 shows a portion of a data center room 100 having several racks 102a, 102b of computing devices 105, e.g., web and database servers, situated on a data center raised flooring 150. FIG. 3 shows a portion of flooring 150 as comprising the smart tile hive 50 of FIG. 2. The portion of raised flooring 150 is partially exposed to show beneath the flooring surface, sources of cooling air 120 such as provided via fans (not shown) conduits or ducts 140 that provide the cooling air to the smart tile hive vents. As shown in FIG. 3, a smart tile vent's opening and closing function is to regulate and control the amount and directionality of cooling air 200 sourced from underneath the data center floor tiling infrastructure that enters the data center room through the smart tile 10'. The determination of the amount to open/close the vent in a smart tile 10' is based on received commands communicated via the mesh smart hive communications network. For example, a hive of tiles may be in communication with a "policy" computer system configured with polices for administration of tile behavior as controlled by remote computing device. The policy computing system provides an interface via which a human enters in data center policies for the hive to carry out. These policies can be broken down by entire data center directives or by some hive directives.

For example, an example policy may specify logic setting forth:
Policy 1:
Keep all servers at temperature=68 F, Humidity=26%
Report failure or delay greater than 1 hour to admin@mycompany.com Another non-limiting example policy may specify logic setting forth:
Policy 2:
Perform the following on each server:
Server 1 at temperature=68 F, Humidity=26%
Server 5 at temperature=55 F, Humidity=26%
All other servers at temperature=75 F, Humidity=29%
Threshold temperature+/−5 F
Threshold humidity+/−5%
Report failure or delay greater than 1 hour to admin@mycompany.com Further, a policy may set forth one or more environmental control settings (e.g., temperature and pressure) for a specific piece of equipment, e.g., single server, or particular area within the data room. In one embodiment, a policy author distributes the policy (e.g., is communicated) to the hive leader(s), who may have previously identified themselves as leaders. Then, individual smart tile hives (or sub-hive) will coordinate and break out under control of the respective tile leader having knowledge of the policy. Thus, the hive will execute whatever it has to do, e.g., send out commands to other smart tiles via mesh network communication to take temperature and humidity readings. Each reading may be accomplished by a respective different tile within the hive. The tiles may then take the respective sensor readings and report back to the hive leader. An additional tile of that hive may be commanded or receive instructions to control the duct, e.g., actuate close or open its vent or control a duct, according to the received policy.

The policy may be communicated specific or as granular as necessary to the tiles. For example, as a policy indicates a desired reading, either the leader only sees the policy, or the other tiles of the hive may see the policy too. If only the leader, then each leader will cull out the part(s) of the policy appropriate to them and distribute tasks to the smart tiles in the hive according to mesh network communications. If all the tiles get the policy, then each of them will cull out the part(s) concerning them. For a policy to address a specific tile, the tiles must have unique identifiers. For example a unique identifier, such as "TILE123". The policy would express the behavior or actions expected by TILE123. It is understood that smart tiles could be addressed by an attribute or type. For example, a tile could be programmed as a "red" tile in which a policy would express behavior expected by tiles of type="red".

For example, referring back to FIG. 2, a hive leader tile 60 control of the hive may be via tile-to-tile mesh communications 62 (as smart tiles know the map of immediate neighbors and hive members). In some embodiments, a smart hive may form according to a particular machine(s) or equipment(s) of the data room. For example, such pieces of equipment may have associated RFID tags (not shown) that can be read by an RFID tag sensor. In this embodiment, RFID tag(s) may be placed in any location on the server. Reading the tag is accomplished by a reader device located within the tag's proximity. A smart hive tile might be able to call on a sensor inside the server rack unit so that it can perform the reading for it. However, the RFID tag might be within proximity to the tile and therefore the tile itself may just read it. That is, an RFID tag sensor may be located on a tile, e.g., in which an RFID tag of a piece of equipment may be monitored if proximate to the tile RFID tag sensor. In this manner, the smart tile will detect an identifier of a piece of equipment and thus know the piece of equipment it is being configured by the hive to monitor. Alternatively, given that a piece of equipment in the data center may physically reside on certain tile(s), not necessarily including smart tile, the RFID identifier of a remote located piece of equipment on a server rack may be sensed by another RFID tag sensor (e.g., located on a server rack) and the RFID of the equipment communicated to an underlying smart tile via wireless communications technology such as via Bluetooth.

In an alternative embodiment, all data room environmental monitoring sensor may be located remote from smart tiles/hives, and the tile may receive communications of sensor readings from throughout the data room. For example, as shown in FIG. 3, a temperature sensor may be located within a server panel with the sensor coupled to a communications device, shown collectively as a unit 120 to transmit sensed temperature values as wireless signals 130 to a smart tile 10.

In this manner, for example, select smart tiles may provide processing and effect control responsive to received sensor readings.

A smart tile installation process is now described. In view of FIG. 2, when a new Smart Tile 70 is installed in the data center 100 of FIG. 3, such as being installed within an existing hive, e.g., hive 50, upon removal from its packaging (not shown), a human installer may switch the tile power on. The Smart Tile 70 is laid into a position on the floor. The new Smart Tile initiates a new tile introduction sequence. Each smart tile 10 or 10' of the hive 50 uses its communication via side markers 20 or with wireless communications capability to communicate 62 with neighboring tiles to facilitate easy neighboring tiles discovery. Neighboring tiles respond with their locations in the hive which the new Smart Tile uses to determine its location in the hive.

Initially, the newly added smart floor tile including embedded system controller with memory and resident O/S, and wireless or wired communications capability via a mesh network communication, may send out information signals, e.g., beacon information, including ID's of neighboring tiles, from which, implementing heuristics, other smart tiles of the hive (or sub-hive) may respond so that an image of the floor may be built. To build a map, the tile location and its dimensions are used. A tile location can be a location in a grid, for example "1,2" meaning that this tile is the second tile in the first row. A computer program intelligent system can construct a map based on this information. Other communications from the smart tile may include generation of a wired or wireless beacon signal, communicated via the mesh, including a policy dictating how the hive is supposed to be functioning, e.g., regulate ambient temperature of the room, and signals communicated to the hive community to cooperatively achieve that temperature control.

In one embodiment, through either a cascading messages 62 across the hive, as in mesh network communications, to the hive leaders or a direct communication to the hive leader, the newly added Smart Tile reports on its proposed position as well as its capabilities such as being able to read RFID's, sense temperature, and/or other environmental condition and whether it has ability to open and close ventilation vents on itself as an example. The smart tile is programmed to know its size and dimension and thus by learning locations of its neighbors it may detect its location in the hive given this information. The smart tile must be able to inform (broadcast) its identifier and its sensor or array of sensors that it maintains. The hive leader 60 may respond to the new Smart Tile whether it has been accepted into the hive and if so whether it should report to the main hive leader or a sub hive leader. The Smart Tile may then receive instructions on what it should listen to and what it should report on including the frequency of measurements or events. Once the new Smart Tile 70 is accepted as a member of the hive, it is able to work as a simple collective to help monitor and manage the data center and handle hive events.

For example, the mesh network may request at 15 minute intervals a temperature sensor reporting event. Each tile responds with its location and temperature. Based on the readings, the hive leader or the hive itself, may determine, via programmed embedded system/controller control, whether the data room controlled condition, e.g., temperature, is as set according to the policy, e.g., that temperature equilibrium is being met at 8:30 AM eastern time. For example, as users come online, check their calendar and check their e-mails, server usage spikes. Then device temperatures begins to rise. Thus, in view of an example heating and cooling scenario depicted in FIG. 3, the hive 50 may subsequently detect that areas proximate to or at racks labeled A5 and A7 have higher temperature readings. For example, the hives may be receiving information from external sensors, such as, a temperature sensor inside a server rack. As the smart tiles 10 or 10' surrounding A5 and A7 know their location due to the build map of the hive infrastructure, they know what to do autonomously. For example, responsive to the determination of excessive temperature readings at these rack locations, the tiles 10' surrounding location A5 and A7 autonomously act to increase the airflow 200 to the specific servers by opening up air ducts/vents 40 around those servers. A smart hive tile or tile leader may further communicate to the hive a call for more cooling. Hive members a few tiles away, corresponding to rack locations B5 and C6 (not shown) know their temperatures are slightly lower that required so they may react in a community way to reduce airflow slightly.

As hive members, the tiles around rack A5 and A7 initiate a request for a smaller time interval for temperature sensing to the hive to better monitor the overheating situation. They do so to be sure the servers that are overheating begin to reach equilibrium as soon as possible. According to the principles described herein, each tile may tell itself to perform this. So for example, a first tile (Tile 1) will monitor every 5 seconds to make sure the issues are cleared. A second tile (Tile 2) might agree and do the same or decide to modify by doing it every 10 seconds though. Similarly, the tile hive leader might be the one that decides this and communicates this to each of the other tiles. If temperatures begin to stabilize, no further action is needed. If temperatures do not stabilize after all the tiles have responded in the vicinity, the hive may call for additional airflow 200 or changed air flow directionality, or alert data center administrator(s).

In the example, after a short period of time, it may be the case that temperature readings from sensors on tiles 10 or 10' proximate to rack A5 begin to stabilize—yet temperature readings about racks around A7 do not stabilize. In this example scenario, prior to the morning's first temperature sensor reporting events, a new set of servers were moved into the vicinity of A7 to handle a new collaboration system with a new software install. Unfortunately, due to a software failure the racks around A7 are reaching their peak temperature. The smart hive 50, in its attempt to solve the heating problem, has determined that a more catastrophic failure has occurred. The hive (e.g., via a hive leader tile) may request a re-read of the RFID tags around location A7. The hive sends an urgent message to the hive leaders for intervention from the floor or raised floor operators.

Figure 4:
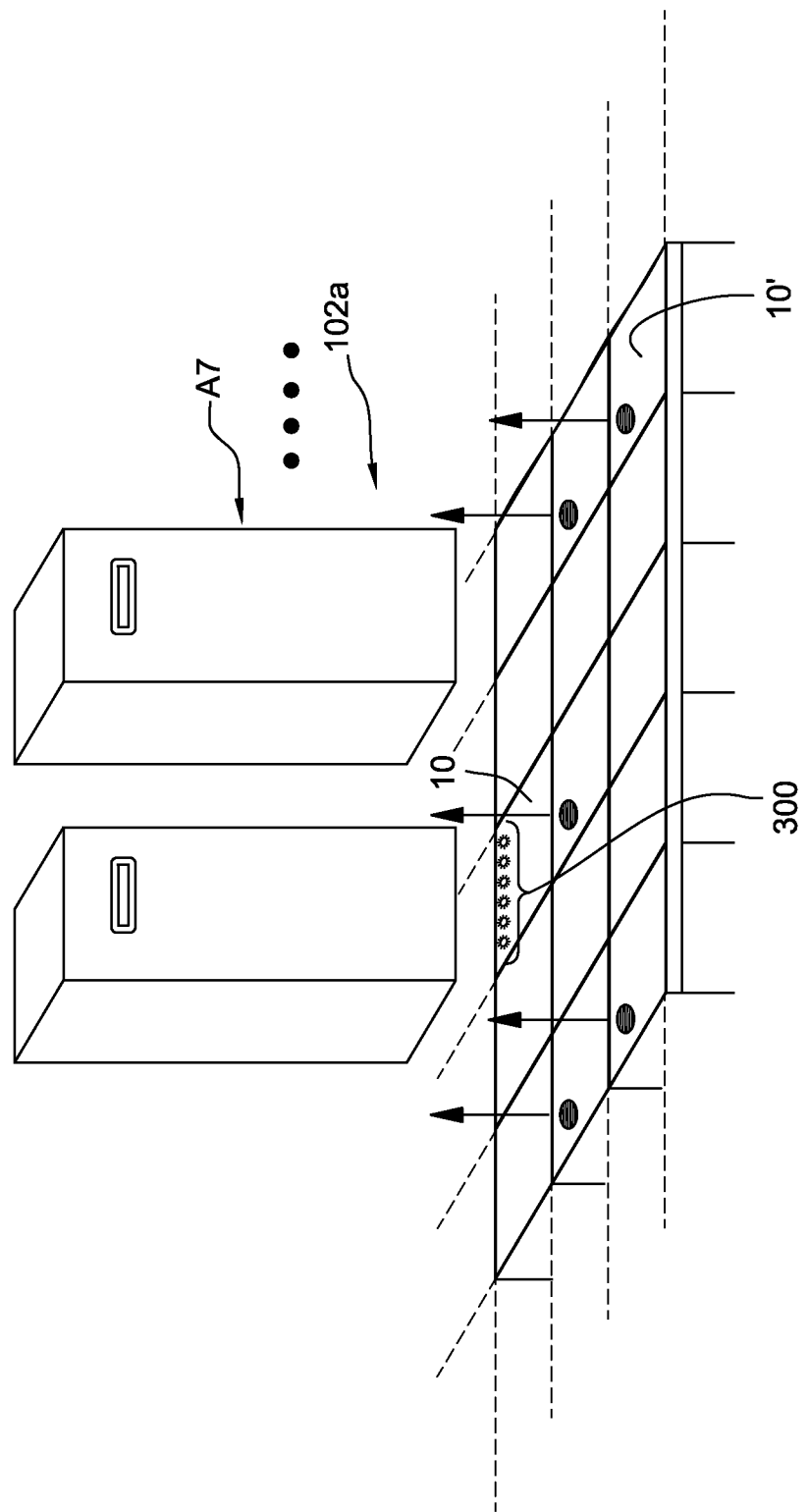
FIG. 4 is a detailed view of the data room center incorporating the smart floor tile hive infrastructure showing illuminating tile lights.

In this example, if a command, e.g., setting ambient temperature of an area to a certain degree, cannot be carried out, e.g., one or more of the hive of smart tiles is programmed to illuminate the problem area. For example, smart tiles forming an area surrounding the example server whose environmental condition setting cannot be regulated according to the policy, e.g., overheating, may be instructed to illuminate a certain color LED. The tiles have knowledge of a particular server on top of it (e.g., using RFID or manual setting), then the hive (or sub-hive) per equipment could illuminate lights to zone it off. In one embodiment, a hive of tiles may break out on its own based on a common criteria, e.g., covering a particular piece of equipment, as detected based on a mesh or wireless communication, or an externally received input. The example overheated equipment may be alternatively be zoned off by manual means. In this example, because the hive of smart tiles has detected a serious over heating condition, they visually alert the staff. That is, as shown in FIG. 4, the smart tiles may be programmed so that the floor area around the overheated equipment server is illuminated with a red LED illumination 300 while all other tiles in the data center are illuminated with a soft blue LED light, for example. The contrast on the data center floor helps the operations staff detect exactly where the overheating situation is and how far it extends.

In a further embodiment, rather than act to address a particular detected issue, a hive or hive leader upon detecting a policy breach, may simply be programmed to initiate an alarm, for example, or notify an operator or one who can manually intervene to address the problem. For example, the sensed RFID information of a overheated server may be provided to an operator or operations staff.

There are additional capabilities of the smart tile with many more extensions. For example, a smart tile does not necessarily have to be part of a raised floor system, nor is it limited to only data room settings, but may be placed in any setting requiring a controlled environment. The smart tile thus may include more sensors of various types besides temperature, humidity, air flow and may be implemented in other controlled environments not just data centers. For example, such smart tiles may be suitable for mounting on a wall or ceiling of any room to perform smart tile functions for environmental control as described herein. The tiles learn from each other their location and how to communicate, elect, and interact with peers, groups, group leaders, and hive leaders. The smart tiles autonomously form a hive or computing collective that is able to carry out unified tasks as a group. The smart tile hive(s) take direction from data center operations in the form of policies (programmed in or communicated to the tiles) and do whatever the hive deems necessary to carry out the policy set forth. Smart Tile hives are able to report and take autonomous action as a group or collective based on policy criteria.

In connection with the methods of sensing or measuring environmental parameters of a room, area, or equipment, this disclosure further encompasses programs, software, or computer instructions embodied or stored in a computer or machine usable or readable medium, which causes the computer or machine to perform the measurement and analytic steps of the method when executed on the computer, processor, and/or machine. A program storage device readable by a machine, e.g., a computer readable medium, tangibly embodying a program of instructions executable by the machine to perform the methods described in the present disclosure is also provided.

The system and methods of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The computer readable medium could be a computer readable storage medium or a computer readable signal medium. Regarding a computer readable storage medium, it may be, for example, a magnetic, optical, electronic, electromagnetic, infrared, or semiconductor system, apparatus, or device, or any suitable combination of the foregoing; however, the computer readable storage medium is not limited to these examples. Additional particular examples of the computer readable storage medium can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an electrical connection having one or more wires, an optical fiber, an optical storage device, or any appropriate combination of the foregoing; however, the computer readable storage medium is also not limited to these examples. Any tangible medium that can contain, or store a program for use by or in connection with an instruction execution system, apparatus, or device could be a computer readable storage medium.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, etc.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

The invention claimed is:

1. A system for controlling environmental conditions in a room comprising:
a plurality of room tiles for placement in said room, each room tile having a sensor to obtain a sensed environment condition information;
a control processing unit embedded in said room tile configured to receive said obtained environment condition information from a sensor of one or more said plurality of room tiles, and in response, regulating said environmental condition in said room according to a desired environmental condition setting, wherein said room tiles each include a communications sub-system configured to communicate signals with communications sub-systems of other room tiles to cooperatively achieve regulating said environmental condition, a communication subsystem of a room tile receiving signals having identifying and positioning information of other room tiles, a control processing unit of a room tile being further configured to build a map of tile locations when placed in said room the control processing unit of a room tile being configured to identify its location relative to other room tiles via received said identifying and positioning information.

2. The system as claimed in claim 1, wherein said control processing unit is configured to communicate or receive signals to build a map of said environmental conditions of said room based on a sensor measurement value of said sensed environmental condition information corresponding to each room tile.

3. The system as claimed in claim 2, wherein said control processing unit is further configured to:
compare a determined environmental condition against said desired environmental condition setting,
determine how to regulate said environmental condition based on said comparison; and one of:
control regulating said environmental condition; or communicate commands to other one or more tiles to control regulating said environmental condition as desired.

4. The system as claimed in claim 2, wherein an environmental condition includes a temperature condition in said room, said tile comprising:
   a vent in operative communication with a source of climate controlled air, and
   an actuator for controlling opening or closing of said vent, said control processing unit of said room tile receiving commands for controlling said actuator to adjust an opening or closing of said vent to provide said climate controlled air, wherein said climate controlled air provided via said vent is regulated based on said adjusted vent opening or closing.

5. The system as claimed in claim 1, wherein said communications sub-system configured to communicate signals with communications sub-systems of other room tiles comprises: one or more conductive structures located at a room tile edge that enable direct signal communication with a communications sub-system of an adjacent room tile via a corresponding receptive conductive one or more structures located at a room tile edge of said adjacent room tile.

6. The system as claimed in claim 5, wherein said source of climate controlled air and vent for supplying said climate controlled air to said room is remotely located from a room tile under control of a vent actuator, said embedded control processing unit cooperatively interacting with said remotely located vent or said vent actuator to regulate said environmental condition in said room.

7. The system as claimed in claim 5, wherein said plurality of room tiles form a hive community configured to cooperatively achieve regulating said environmental condition, said hive community communicating among each other via said tile communications sub-systems to:
   designate a tile of said community as a hive leader;
   relay sensed operating conditions of said room to a control processing unit of a designated room tile; said designated room tile building said map of said sensed environmental conditions of said room; and
   cooperatively interact to regulate said environmental condition in said room.

8. The system as claimed in claim 7, wherein said one or more designated room tiles receives instructions from a remotely located control device, said hive community responsive to said remote instructions.

9. The system as claimed in claim 7, wherein said room tile further comprises: one or more light sources, each light source configured to become illuminated in a first manner to indicate that environmental condition in said room is achieved, or configured to become illuminated a second manner to indicate that environmental condition in said room is not corrected,
   wherein said hive community is configured to cooperatively interact to generate illuminated tiles according to said first or second manner.

10. A method of controlling environmental conditions in a room comprising:
    providing a plurality of smart room tiles on a floor, one or more smart room tiles comprising:
       at least one sensor embedded in said smart room tile to obtain environment condition information of a room including the smart room tile; and
       a control processing unit receiving indication of a desired environmental condition of the room; and,
       a communications sub-system embedded in said tile, said communications sub-system configured to communicate signals according to a communication protocol,
    receiving at a communications sub-system of one or more smart room tiles, one or more signals indicating a desired environmental condition setting;
    receiving at a communication subsystem of one or more smart room tiles signals including identifying and positioning information of other smart room tiles, said control processing unit of a said smart room tile being further configured to build a map of smart room tile locations when placed in said room, and
    identifying by the control processing unit of a smart room tile, a location of said smart room tile relative to other smart room tiles based on said received identifying and positioning information;
    communicating signals amongst one or more other smart room tiles with said desired environmental condition setting; and
    using said one or more smart room tiles to cooperatively achieve regulating said environmental condition according to the desired environmental condition setting.

11. The method as claimed in claim 10, further comprising:
    receiving at a communication subsystem of a smart room tile signals communicated from other smart room tiles having sensor readings of an environmental condition, said control processing unit of said smart room tile being further configured to build a map of said environmental conditions of said room based on said sensor measurement value of said environmental condition corresponding to each said other smart room tile.

12. The method as claimed in claim 11, further comprising:
    comparing, at a control processing unit of a smart room tile, a determined environmental condition against said desired environmental condition setting,
    determining how to regulate said environmental condition based on said comparison; and one of:
    regulating said environmental condition; or
    communicating commands to other one or more smart room tiles to control regulating said environmental condition as desired.

13. The method as claimed in claim 12, wherein one or more smart room tiles further comprises:
    a vent in operative communication with a source of climate controlled air; and
    an actuator for controlling opening or closing of said vent, wherein an environmental condition includes a temperature condition in said room, and to cooperatively achieve regulating said method further comprises:
    receiving at said control processing unit of said smart room tile, one or more commands for controlling said actuator to adjust an opening or closing of said vent to provide said climate controlled air, wherein said climate controlled air provided via said vent is regulated based on said adjusted vent opening or closing.

14. The method as claimed in claim 13, wherein said source of climate controlled air and said vent under control of a vent actuator for supplying said climate controlled air to said room is remotely located from a smart room tile, wherein to cooperatively achieve said regulating, said method further comprises:
    communicating signals to a controller unit for said vent actuator associated with said remotely located vent to adjust said vent opening to regulate said environmental condition in said room.

15. The method as claimed in claim 13, wherein said plurality of smart room tiles form a hive community configured to cooperatively achieve regulating said environmental condition, said hive community communicating amongst each other via said communications sub-systems, wherein said method further comprises:

designating a smart room tile of said community as a hive leader;

relaying sensed operating conditions of said room to a control processing unit of a designated room tile, said designated room tile building said map of said sensed environmental conditions of said room, and cooperatively interacting with other smart room tiles to regulate said environmental condition in said room.

16. The method as claimed in claim 15, further comprising:
receiving instructions at said designated smart room tile from a remotely located controller unit, wherein tiles of said hive community are responsive to said remote received instructions.

17. The method as claimed in claim 15, wherein said smart room tile further comprises one or more light sources, each light source configured to become illuminated via control signals from said control processing unit, wherein said method comprises:

illuminating said one or more light sources in a first manner to indicate that environmental condition in said room is achieved; or illuminating said one or more light sources in a second manner to indicate that environmental condition in said room is not corrected, wherein said hive community is configured to cooperatively interact to generate illuminated tiles according to said first or second manner.

* * * * *